United States Patent [19]
Lo et al.

[11] Patent Number: 6,096,645
[45] Date of Patent: Aug. 1, 2000

[54] METHOD OF MAKING IC DEVICES HAVING STABLE CVD TITANIUM NITRIDE FILMS

[75] Inventors: Yung-Tsun Lo, Luo-Dong; Hui-lun Chen, Yi-lan; Wen-Yu Ho, Yeong-Kang; Sung-chun Hsieh, Taipei; Feng-hsien Chao, Jang-Huah, all of Taiwan

[73] Assignee: Mosel Vitelic, Inc., Taiwan

[21] Appl. No.: 09/034,863

[22] Filed: Mar. 4, 1998

[30] Foreign Application Priority Data

Jul. 24, 1997 [TW] Taiwan .................................. 86110565
Aug. 8, 1997 [TW] Taiwan .................................. 86111414

[51] Int. Cl.[7] ................................................. H01L 21/44
[52] U.S. Cl. ........................... 438/680; 438/622; 134/1.2
[58] Field of Search ................................... 438/680, 681, 438/622; 134/1.1, 1.2, 1.3

[56] References Cited

U.S. PATENT DOCUMENTS

| 5,212,119 | 5/1993 | Hah et al. | 438/763 |
|---|---|---|---|
| 5,576,071 | 11/1996 | Sandhu | 427/534 |
| 5,612,558 | 3/1997 | Harshfield | 257/298 |
| 5,710,070 | 1/1998 | Chan | 438/21 |
| 5,731,239 | 3/1998 | Wong et al. | 438/296 |

*Primary Examiner*—John F. Niebling
*Assistant Examiner*—John Murphy
*Attorney, Agent, or Firm*—Heller Ehrman White & McAuliffe, LLP

[57] ABSTRACT

A method of forming a CVD nitride (e.g., titanium nitride) film on a substrate. The as-deposited nitride film is treated by a plasma of a high power density (preferably between approximately 200 W and 300 W) for a prolonged duration of time (preferably between approximately 32 s and 52 s) to reduce the tendency of the resistance and thickness of the as-deposited film to change because of either time of exposure to atmosphere or subsequent processing steps.

4 Claims, 4 Drawing Sheets

METHOD OF MAKING IC DEVICES HAVING STABLE CVD TITANIUM NITRIDE FILMS

BACKGROUND OF THE INVENTION

1. Field of the Invention

This invention relates to a method of making chemical-vapor-deposited (CVD) nitride (e.g. titanium nitride) films having highly stable properties including film resistance and thickness, and more particularly to the use of a high-power, long-duration plasma treatment step to reduce the tendency of the resistance and thickness of the as-deposited nitride film to change with time.

2. Description of the Prior Art

Chemical vapor deposition (CVD) is a material synthesis method in which the constituents of the vapor phase react to form a solid film at the surface of a substrate. The growth of thin films by CVD has been one of the most important methods of film formation in the fabrication of integrated circuits (ICs) such as very large system integration (VLSI) and ultra-large system integration (ULSI) devices. The importance of the CVD technology is ever increasing as the IC line width is shrinking toward quarter-micron and beyond.

The rapidly growing importance of CVD lies primarily in its versatility for depositing a large variety of elements and compounds at relative low temperatures to form both vitreous and crystalline layers having a high degree of perfection and purity. Compared to other deposition techniques, e.g. sputtering deposition, it is generally easier to use CVD to create films having better crystallinities and more accurately controlled stoichiometric compositions. As a result, films made by CVD generally have better-controlled physical and material properties. Thus, while sputtering deposition is used primarily for the deposition of a limited number of metal films, e.g., aluminum-copper-silicon (Al—Cu—Si) and titanium (Ti) films, in VLSI or ULSI devices, a much greater percentage of dielectric and conductive films in such devices are now formed by CVD, including silicon oxide ($SiO_2$), silicon nitride ($Si_3N_4$), phosphosilicate glass (PSG), titanium nitride (TiN), borophosphosilicate glass (BPSG), and tungsten (W) films.

Moreover, as the IC line width shrinks below 0.2 $\mu$m, TiN films deposited by physical vapor deposition (PVD) techniques upon via holes or contact holes can no longer provide a topographical coverage that satisfies process requirements imposed by the subsequent tungsten plug process. As a consequence, CVD processes are gradually replacing PVD as the standard method for making TiN thin films in IC devices.

A typical prior-art CVD TiN film formation process involves the thermal decomposition of one or more titanium-nitride-based organometallic compounds, e.g., tetrakis-dimethylamino titanium (TDMAT), followed by the formation of a carbon-containing TiN film. The as-deposited, porous TiN film is then treated by nitrogen and hydrogen plasma to reduce its organic carbon content. Typically, the nitrogen gas flow rate is 200–300 sccm, the hydrogen gas flow rate is 300–400 sccm, the plasma power density is approximately 200 W or under, and the plasma treatment time is approximately 30 sec or under. However, the TiN film formed after such a plasma treatment tends to absorb oxygen in the atmosphere if vacuum is broken. Such intake of oxygen invariably causes surface resistance and resistivity of the film to rise, resulting in an increase in the RC value of the IC device. Significantly, breaking of vacuum is virtually inevitable in IC processing. This is because a great number of different process steps must be performed to make a modern IC device and because vacuum is generally inevitably broken when the wafer is transferred from one process equipment to another. Thus, breaking of vacuum has a significant adverse impact on TiN thin films deposited by a conventional CVD process.

FIG. 1 illustrates the adverse effect of exposure to atmosphere on several TiN films formed by a conventional CVD process. As indicated by line 2 in FIG. 1, the initial RC value of the TiN film deposited upon a 0.65 $\mu$m via hole is approximately 30 ohms. After a breaking of vacuum for 24 hours, the RC value of the film is almost doubled at 60 ohms. Similar changes are observed in TiN films deposited on a 0.6 $\mu$m (line 4) and a 0.65 $\mu$m (line 6) via hole, respectively.

In addition to the aforesaid resistance change problem in TiN films caused by breaking of vacuum, the resistance and resistivity of the TiN film may also increase because of other process-related reasons. For example, a rapid thermal nitridation (RTN) process is typically conducted to make a barrier layer on top of an as-deposited TiN film. Such RTN process may also raise the surface resistance of the as-deposited TiN film.

SUMMARY OF THE PRESENT INVENTION

It is therefore an object of the present invention to provide a method of making CVD titanium nitride films having stable properties such as film resistance and thickness.

It is another object of the present invention to provide a method of making CVD TiN thin films that is compatible with subsequent process steps such as rapid thermal nitridation.

It is a further object of the present invention to a CVD TiN film that has stable properties including film resistance and thickness irrespective of subsequent processing or breaking of vacuum.

Briefly, in a specific embodiment of the invention, a nitride (e.g., titanium nitride) film deposited on a substrate by CVD is treated by a high-power plasma for a prolonged duration of it, time to reduce the tendency of the resistance and thickness of the as-deposited film to change because of either time of exposure to atmosphere or subsequent processing steps.

An advantage of the present invention is that it provides CVD nitride films having highly stable properties in comparison with conventional CVD methods or other deposition methods.

Another advantage of the present invention is that it provides a CVD titanium nitride film that is more compatible with subsequent process, e.g., RTN, than conventional CVD methods or other deposition methods.

These and other objects, features and advantages of the present invention will no doubt become apparent to those skilled in the art after reading the following detailed description of the preferred embodiment which is illustrated in the several figures of the drawing.

IN THE DRAWINGS

DETAILED DESCRIPTION OF THE PREFERRED EMBODIMENTS

While the present invention may be embodied in many forms, details of a preferred embodiment are schematically shown in FIGS. 2 through 8, with the understanding that the present disclosure is not intended to limit the invention to the embodiment illustrated.

According to one aspect of the present invention, a nitride (e.g., titanium nitride) film deposited on a substrate by chemical vapor deposition (CVD) is treated by a high-power plasma for a prolonged period of time to reduce the tendency of the as-deposited porous film to absorb atmospheric oxygen during a breaking of vacuum.

According to another aspect of the present invention, the surface resistance and resistivity of a CVD TiN film that has been exposed to the atmosphere (e.g., because of breaking of vacuum) may be reduced by treating the film with a high-power plasma for a prolonged period of time before the substrate is subjected to the next process step (e.g., a tungsten plug process).

To illustrate the aforesaid aspects of the present invention, FIGS. 2 through 6 depict the process steps of forming a contact window having a TiN thin film that serves as the barrier layer or adhesive layer for films that will subsequently be deposited on the contact window.

Figure 2:
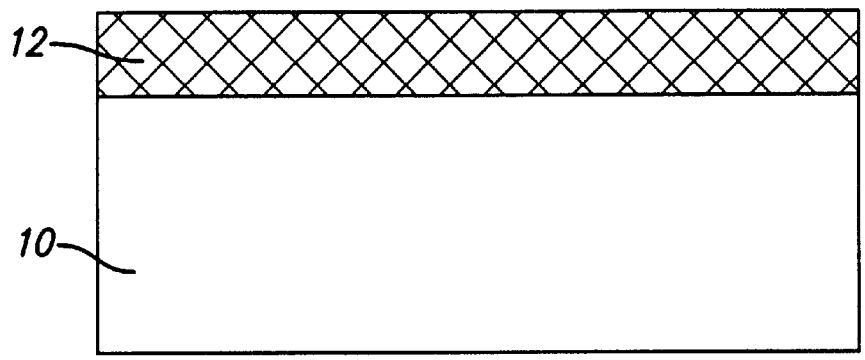
FIG. 2 is a schematic cross-sectional representation of an IC device of the present invention comprising an IC element formed on a substrate.

FIG. 2 is a cross-sectional representation of a substrate 10 and an IC element 12 formed on the substrate 10. Typically, the substrate 10 is a silicon substrate while the IC element 12 is an electrical interconnect or a contact area.

Figure 3:
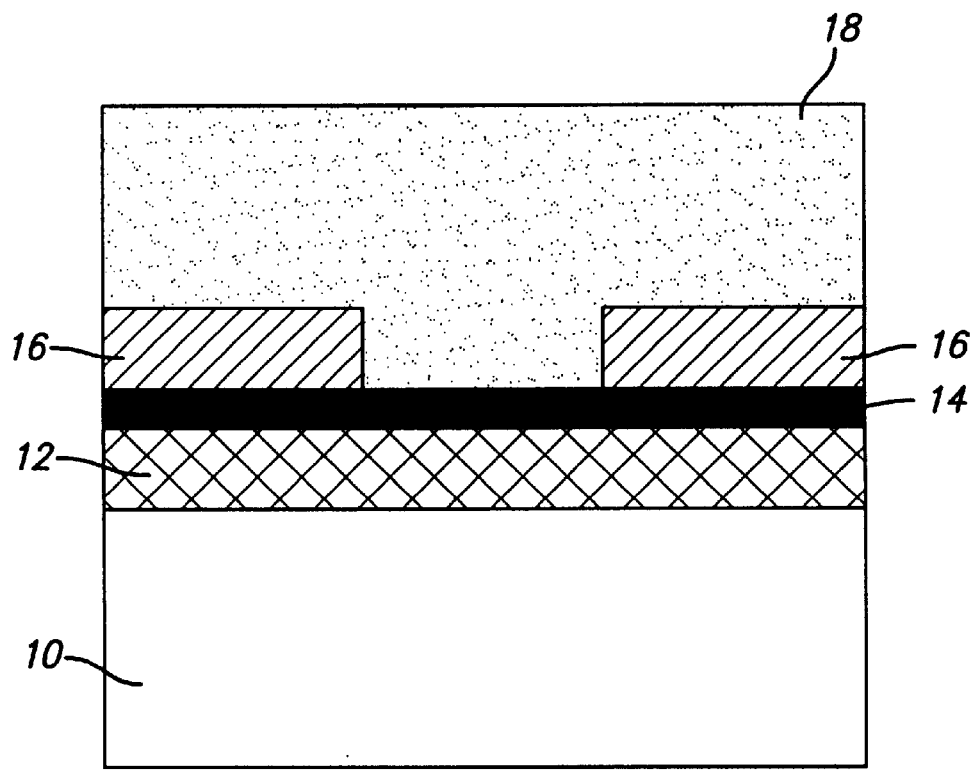
FIG. 3 is a schematic cross-sectional representation of the IC device of FIG. 2, further comprising an insulating layer, a metallic layer and a dielectric layer.

Next, referring to FIG. 3, an insulating layer 14 is formed on top of the IC element 12. Typically, the insulating layer 14 is a $SiO_2$ layer formed by plasma-enhanced chemical vapor deposition (PECVD). A metallic layer 16, e.g., Al, Al—Cu or Al—Cu—Si, is subsequently deposited and lithographically patterned on top of the insulating layer 14. A dielectric layer 18 is then deposited on top of the metallic layer 16 and the exposed portion of the insulating layer 14. Typically, the dielectric layer 18 is a $SiO_2$, $Si_3N_4$ or tetra-ethanolorthosilicate (TEOS) layer formed by PECVD, and is approximately 0.8–2.0 μm thick.

Figure 4:
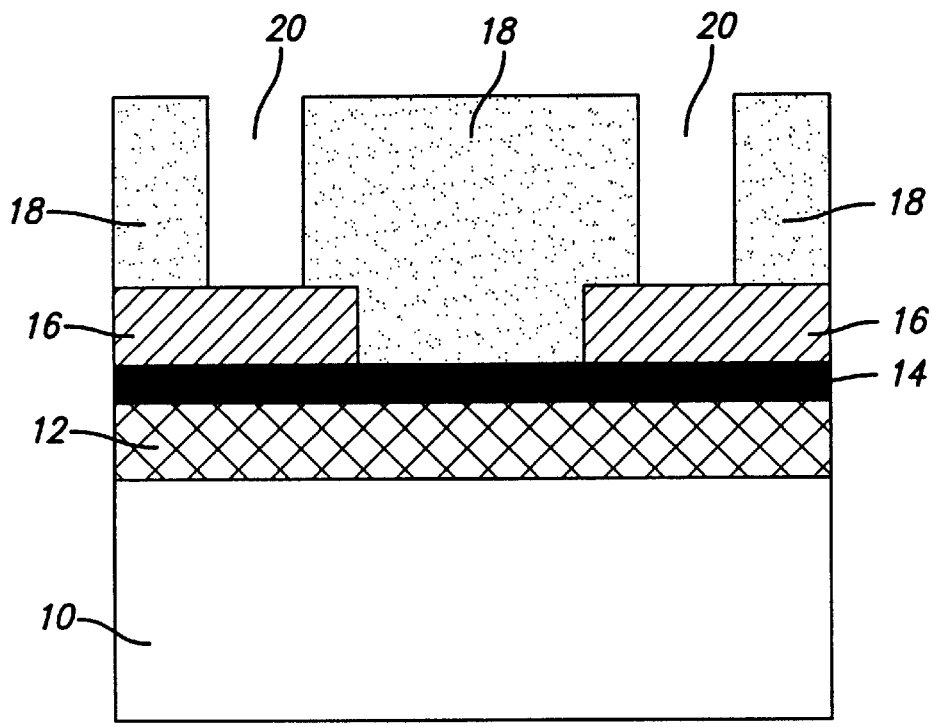
FIG. 4 is a schematic cross-sectional representation of the IC device of FIG. 3, further including via holes formed in the dielectric layer.

Next, referring to FIG. 4, portions of the dielectric layer 18 are anisotropically etched by a dry etch process to form via holes 20.

Figure 5:
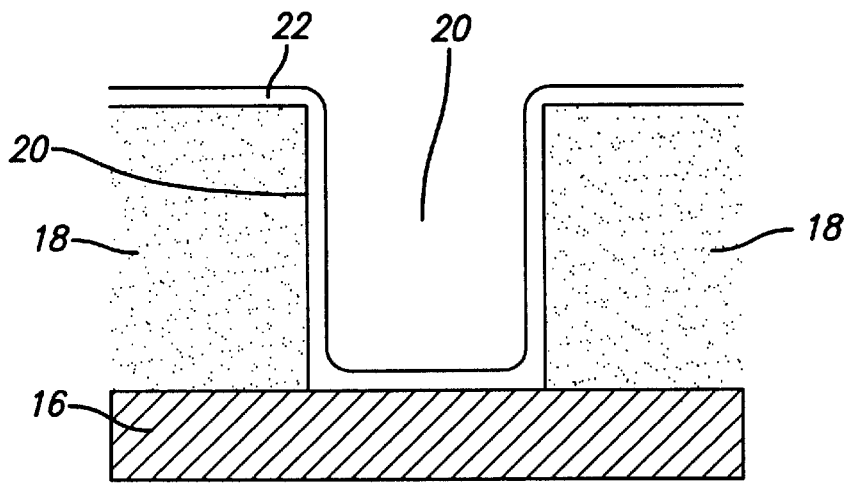
FIG. 5 is a schematic cross-sectional representation of one of the via holes of FIG. 4, further having a Ti layer deposited thereon.

A titanium layer 22 is subsequently deposited by a PVD process on the surfaces of the via holes 20; see FIG. 5. The Ti layer is typically 50 to 100 nm thick.

Figure 1:
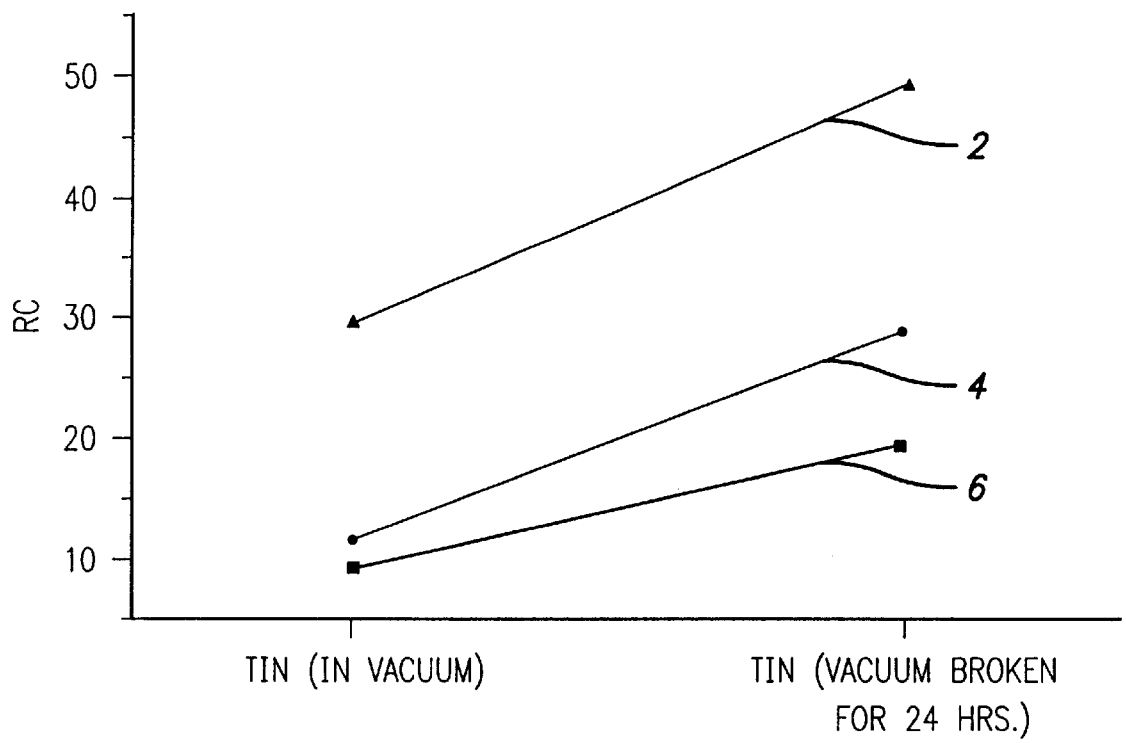
FIG. 1 is a graphical representation of the RC value of prior-art CVD TiN films as a function of time of exposure to atmosphere.
Figure 6:
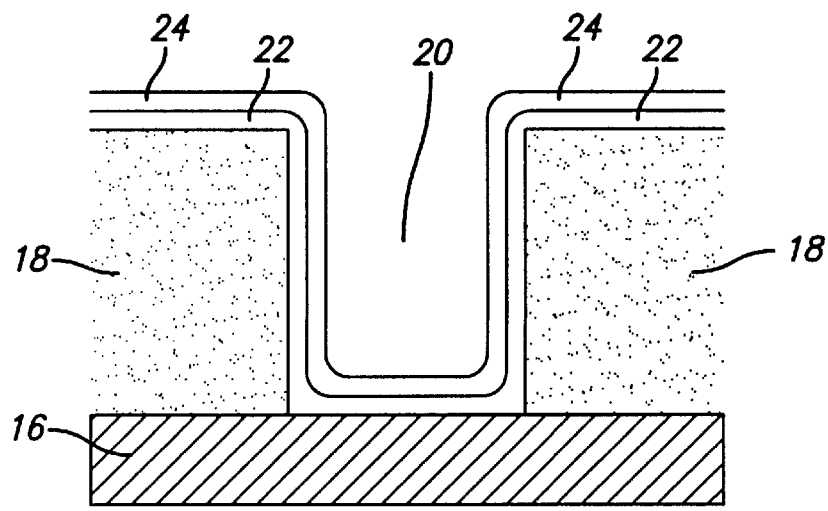
FIG. 6 is a schematic cross-sectional representation of the Ti-covered via hole of FIG. 5, further having a CVD TiN layer deposited thereon.

Referring to FIG. 6, a TiN layer 24 is deposited on top of the Ti layer by a CVD process. The TiN layer is typically 20 to 30 nm thick.

As described above, the as-deposited TiN layer 24 tends to absorb oxygen in the atmosphere in the event of, e.g., breaking of vacuum. Such absorption of atmospheric oxygen will increase the surface resistance and resistivity of the TiN layer 24. To reduce such undesirable increase caused by exposure to atmosphere, the as-deposited TiN film of the present invention is treated with a nitrogen and hydrogen plasma at a plasma power density higher than the conventional value for a longer duration of time. Typically, a $N_2$—$H_2$ plasma having a power density between approximately 200 W and 700 W, and preferably between approximately 200 W and 300 W, is used to treat the as-deposited TiN film for a duration between approximately 30 seconds and 70 seconds, and preferably between approximately 32 seconds and 52 seconds. Adverse effects such as device damage and charging of gate oxide (or other elements) may occur if the power density is too high or the duration is too long. Typically, the $N_2$ gas flow rate is between 200 and 900 sccm, and the $H_2$ gas flow rate is between 300 and 900 sccm.

Table I below shows increases in surface resistance (Rs) as a function of time of exposure to atmosphere for several identical CVD TiN films. Obviously, the increases in Rs caused by such exposure are significantly reduced when the as-deposited CVD TiN film is treated with a $H_2$—$H_2$ plasma of a higher power density for a longer duration of time.

TABLE I

| PLASMA | | TIME OF EXPOSURE (hrs.) | | | | |
|---|---|---|---|---|---|---|
| Power Density (W) | Duration (sec) | 0 Rs (Ω/□) % change | 0.6 Rs (Ω/□) % change | 1.4 Rs (Ω/□) % change | 2.0 Rs (Ω/□) % change | 17.3 Rs (Ω/□) % change |
| 200 | 32 | 344.2/ 0 | 358.2/ 4.06 | 367.9/ 6.89 | 375.8/ 9.18 | 384.8/ 11.80 |
| 200 | 52 | 249.0/ 0 | 258.2/ 3.69 | 265.6/ 6.69 | 269.7/ 8.31 | 275.2/ 10.50 |
| 300 | 32 | 252.5/ 0 | 261.8/ 3.69 | 268.7/ 6.43 | 273.3/ 8.23 | 278.7/ 10.37 |
| 300 | 52 | 229.9/ 0 | 238.2/ 3.61 | 242.9/ 5.65 | 247.2 7.52 | 251.3/ 9.31 |

Table II below shows changes in film thickness (measured in Angstroms) as a function of time for CVD TiN films exposed to atmosphere. Again, the changes in thickness caused by such exposure are significantly reduced when the as-deposited CVD TiN film is treated by a $N_2$—$H_2$ plasma of a higher power density for a longer duration of time.

TABLE II

| PLASMA | | TIME OF EXPOSURE (hrs.) | | | | |
| --- | --- | --- | --- | --- | --- | --- |
| Power Density (W) | Duration (sec) | 0 Thickness / % change | 0.6 Thickness / % change | 1.4 Thickness / % change | 2.0 Thickness / % change | 17.3 Thickness / % change |
| 200 | 52 | 154.47/ 0 | 157.18/ 1.75 | 160.03/ 3.60 | 161.20/ 4.36 | 161.77/ 4.73 |
| 300 | 32 | 168.22/ 0 | 170.80/ 1.56 | 174.06/ 3.47 | 173.04/ 3.25 | 175.15/ 4.12 |
| 300 | 52 | 143.75/ 0 | 144.43/ 0.47 | 147.41/ 2.55 | 148.04/ 2.98 | 148.67/ 3.42 |

Table III below shows the resistivity of CVD TiN films as a function of $N_2$—$H_2$ plasma treatment. The resistivity of a CVD TiN film treated by a $N_2$—$H_2$ plasma of a higher power density for a longer duration of time is significantly lower than that of a CVD TiN film treated by a conventional plasma treatment having a power density of 200 W for a duration of 32 seconds.

TABLE III

| Power Density (W) | 200 | 200 | 300 | 300 |
| --- | --- | --- | --- | --- |
| Duration (sec) | 32 | 52 | 32 | 52 |
| Resistivity ($\mu\Omega$-cm) | 583.50 | 384.63 | 424.25 | 330.48 |

Figure 7:
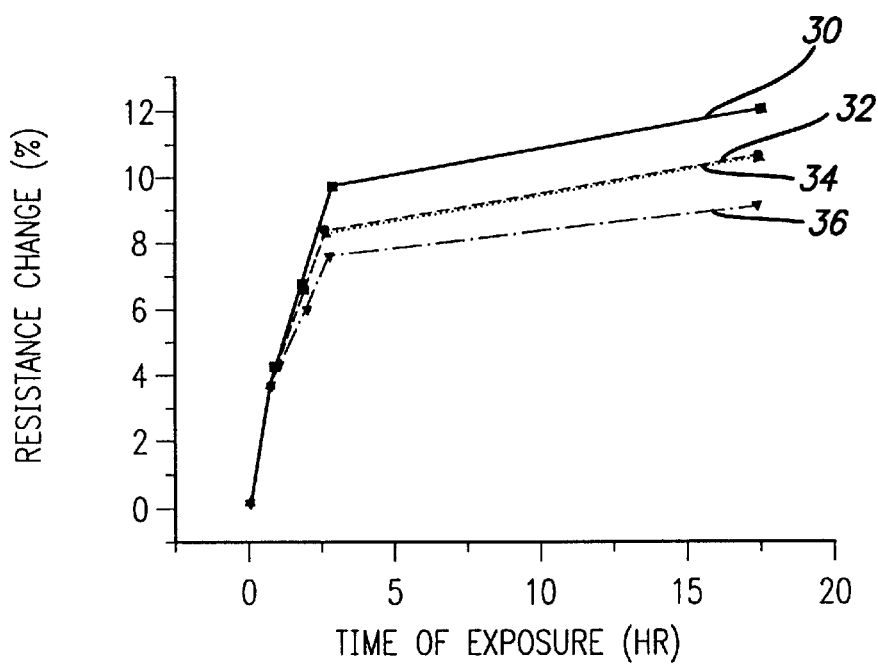
FIG. 7 is a graphical representation of the effect of plasma treatment of the present invention on changes in the surface resistance of CVD TiN films.

FIG. 7 is a graphical representation of the changes of Rs as a function of exposure time shown in Table I. Thus, line 30 shows the Rs change of a CVD TiN film treated by a conventional $N_2$—$H_2$ plasma treatment. In comparison, line 32 (an identical CVD TiN film treated by a $N_2$—$H_2$ plasma of 200 W for 52 sec), line 34 (an identical CVD TiN film treated by a $N_2$—$H_2$ plasma of 300 W for 32 sec), and line 36 (an identical CVD TiN film treated by a $N_2$—$H_2$ plasma of 300 W for 52 sec) all show reduced Rs changes as a function of exposure time.

Figure 8:
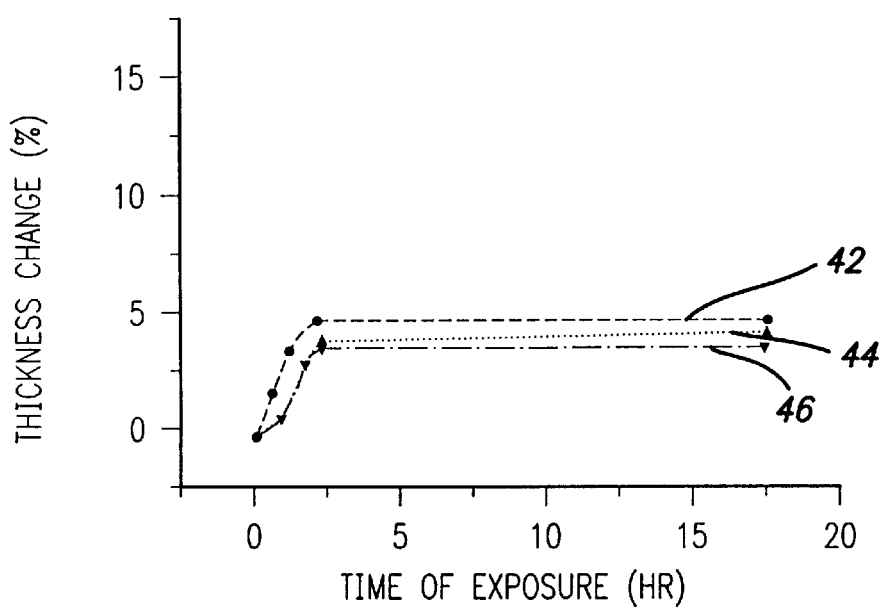
FIG. 8 is a graphical representation of the effect of plasma treatment of the present invention on changes in the thickness of CVD TiN films.

FIG. 8 is a graphical representation of the changes of thickness as a function of exposure time shown in Table II. Thus, line 42 (an identical CVD TiN film treated by a $N_2$—$H_2$ plasma of 200 W for 52 sec), line 44 (an identical CVD TiN film treated by a $N_2$—$H_2$ plasma of 300 W for 32 sec), and line 46 (an identical CVD TiN film treated by a $N_2$—$H_2$ plasma of 300 W for 52 sec) all show reduced thickness changes as a function of exposure time.

The aforementioned high-power, long-duration plasma treatment can also be used to solve or mitigate the resistance increase problem caused by process-related reasons. For example, remnant oxygen in an RTN chamber may accumulate at the surface of a CVD TiN film during rapid heating, causing the Rs value of the film to increase rapidly. The high-power, long-duration plasma treatment of the present invention can help reduce such adverse changes in the Rs value of the film.

In conclusion, the present invention can be used to effectively reduce changes of surface resistance and thickness of as-deposited CVD nitride (e.g., TiN) films caused by, e.g., the exposure to atmosphere or a subsequent RTN process. In addition, the present invention can be used to reduce the resistivity of the as-deposited CVD TiN films caused by exposure to atmosphere. Thus, the present invention can be used to form CVD TiN films having better controlled properties, which will be beneficial to the fabrication of IC devices, particularly if the line width of the device is reduced to 0.2 $\mu$m and below;

While the present invention has been particularly shown and described with reference to the above preferred embodiment, it is to be understood by those skilled in the art that many other modifications and variations may be made thereto without departing from the broader spirit and scope of the invention as set forth in the claims. The specification and drawings are accordingly to be interpreted as being illustrative, rather than being restrictive.

What is claimed is:

1. A method of forming an IC device on a substrate, said IC device having a plurality of via holes, comprising the steps of:

forming an insulating layer on said substrate;

depositing and patterning a metallic layer on top of said insulating layer, exposing portions of said insulating layer;

depositing a dielectric layer on top of said patterned metallic layer and said exposed portions of said insulating layer;

anisotropically etching portions of said dielectric layer, forming said via holes;

depositing a CVD titanium nitride layer on top of said titanium layer;

treating said nitride layer with a plasma having a power density between approximately 200 W and 300 W for a duration of between approximately 32 s and 52 s.

2. The method of claim 1, wherein said plasma is formed by hydrogen gas and nitrogen gas.

3. The method of claim 2, wherein the gas flow rate of said hydrogen gas is approximately between 300 and 900 sccm and the gas flow rate of said nitrogen gas is approximately between 200 and 900 sccm.

4. The method of claim 1, wherein said dielectric layer is selected from the group consisting of a silicon oxide layer, a silicon nitride layer and a TEOS layer.

* * * * *